United States Patent [19]
Blocher et al.

[11] Patent Number: 5,446,617
[45] Date of Patent: Aug. 29, 1995

[54] BALLAST CIRCUIT ENCLOSURE AND GROUNDING STRUCTURE

[75] Inventors: Troy E. Blocher, North Manchester; Daniel P. O'Brien, Fort Wayne, both of Ind.

[73] Assignee: Diversitec Incorporated, Columbia City, Ind.

[21] Appl. No.: 242,311

[22] Filed: May 13, 1994

[51] Int. Cl.⁶ .............................................. H02B 1/18
[52] U.S. Cl. ...................................... 361/674; 174/51; 174/DIG. 2; 315/276; 336/90; 361/704; 361/753; 361/799
[58] Field of Search ...................... 174/35 R, DIG. 2; 315/276; 336/90; 361/674, 704, 714, 720–721, 735, 752, 753, 796, 799, 800, 816, 818

[56] References Cited

U.S. PATENT DOCUMENTS

| | | | |
|---|---|---|---|
| 2,308,600 | 1/1943 | Gaynor | 361/674 |
| 2,740,905 | 4/1956 | Henderson | 174/DIG. 2 |
| 3,049,579 | 8/1962 | Sulzer | 174/DIG. 2 |
| 3,299,200 | 1/1967 | Sulzer | 174/DIG. 2 |
| 4,471,898 | 9/1984 | Parker | 361/394 |
| 5,140,225 | 8/1992 | Barton | 174/DIG. 2 |

FOREIGN PATENT DOCUMENTS

| | | | |
|---|---|---|---|
| 2705708 | 8/1978 | Germany | 174/16.3 |
| 2833043 | 2/1979 | Germany | 361/704 |
| 3144131 | 5/1983 | Germany | 361/796 |
| 0489361 | 6/1992 | Germany | 174/16.3 |

OTHER PUBLICATIONS

Two (2) photographs of Magnetek ballast (no known date).

*Primary Examiner*—Gregory D. Thompson
*Attorney, Agent, or Firm*—George Pappas

[57] ABSTRACT

A ballast circuit enclosure and grounding structure for electrically grounding a ballast circuit to a housing and for capturing transmitted RFI and EMI therefrom. The ballast circuit enclosure includes an elongate housing for receiving and surrounding the ballast circuit. End caps are attached to the housing opposite open ends in closing engagement with the housing. The end caps are fastened to the housing with fastening members extending through holes in the end caps and into elongate channels formed on the inside of the housing. The ballast circuit board rests on elongate abutment shoulders within the housing and is sandwiched between the abutment shoulders and longitudinal walls forming the elongate channels. A grounding wire on the edge of the circuit board is coupled to the ballast circuit and is in electrical contact with the fastening member and/or the channel forming elongate wall of the housing.

19 Claims, 2 Drawing Sheets

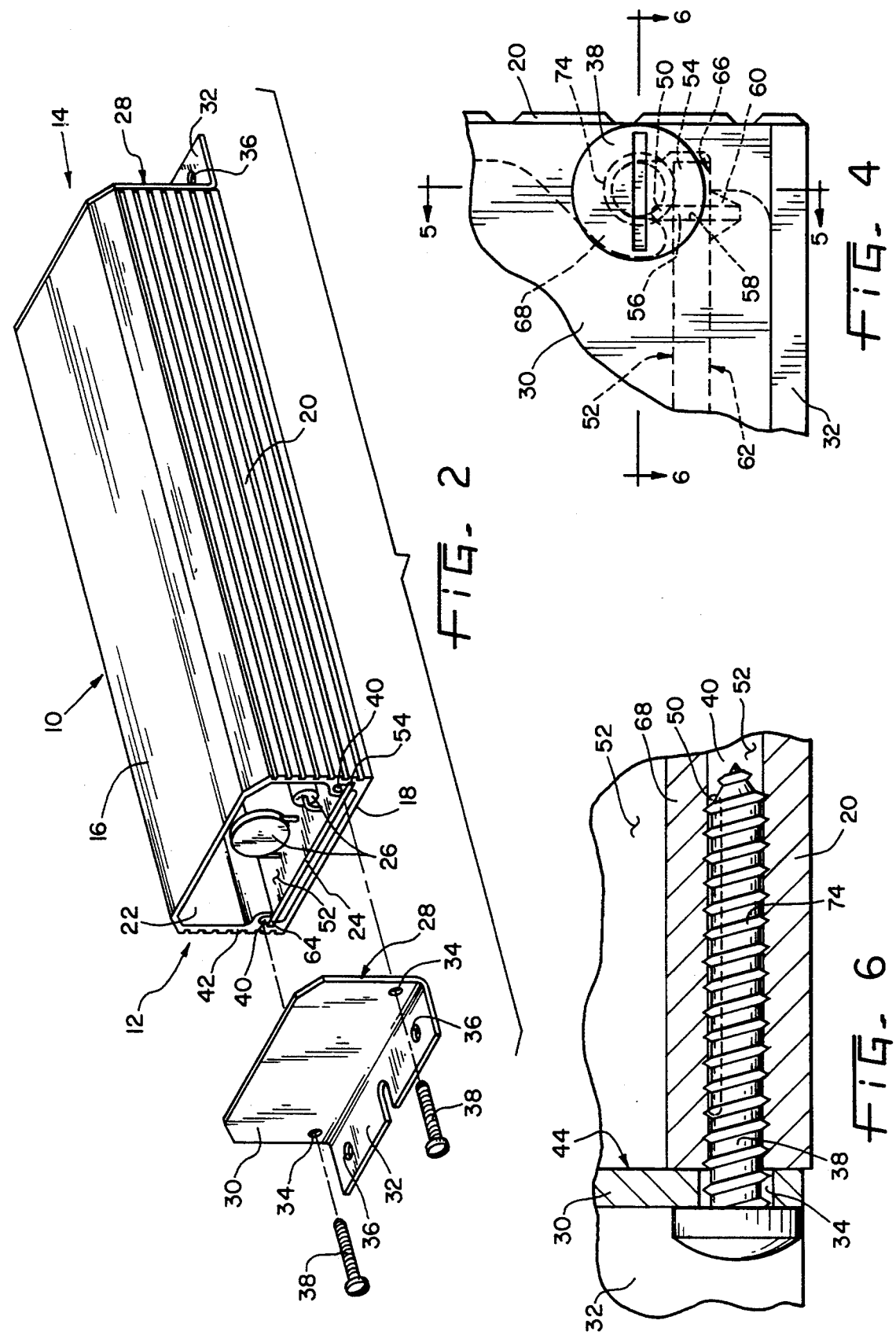

BALLAST CIRCUIT ENCLOSURE AND GROUNDING STRUCTURE

TECHNICAL FIELD

The present invention relates to the technical field of ballasts for energizing gas discharge lamps such as fluorescent lamps. More particularly, the present invention relates to a ballast circuit enclosure and grounding structure whereby an electronic or other type of ballast circuit placed on a circuit board can effectively and inexpensively be supported and provided with proper grounding and enclosed for decreasing transmission of radio frequency interference (RFI) and electro-magnetic interference (EMI).

BACKGROUND OF THE INVENTION

Gas discharge lamps such as fluorescent lamps are today commonly used in many different lighting applications in houses, factories, and other commercial buildings. These lamps require a ballast circuit for modifying the available alternating current power source to a proper frequency and voltage level and driving the gas discharge lamp or fluorescent lamp. These ballast circuits take on many different forms and incorporate various electronic components as may be needed for the specific applications.

All ballast circuits, however, should be properly connected to earth ground and should also be properly shielded to effectively prevent RFI and EMI from being transmitted therefrom and possibly interfering with other nearby devices. The connection to earth ground is typically provided by connecting the ballast circuit grounding node to the lamp fixture housing which, in turn, is normally connected to earth ground by the installation electrician. Many different methods have been devised for making the connection between the grounding node and the lamp fixture. However, these methods have, in the past, exhibited unreliable, ineffective and costly characteristics.

Many different methods and enclosures have also been devised for unwanted noise shielding. Unfortunately, many of these enclosures have been generally ineffective for their intended purpose and have also been unnecessarily costly to manufacture and put to use.

Accordingly, a need exists for a ballast circuit enclosure and grounding structure for effectively decreasing the transmission of RFI and EMI from the ballast circuit and for effectively providing a grounding connection between the ballast circuit and the lamp fixture in a generally inexpensive and efficient manner.

SUMMARY OF THE INVENTION

It is the principal object of the present invention to overcome the above-discussed disadvantages associated with prior ballast circuit enclosures and grounding structures.

The present invention overcomes the disadvantages associated with prior ballast circuit enclosures by providing an elongate housing wherein the ballast circuit is received and completely surrounded thereby. The elongate housing has first and second opposite open ends whereat end caps are provided in closing engagement with the housing. The housing is electrically connected to the grounded lamp fixture and, therefore, any RFI and EMI created by the ballast circuit is captured by the elongate housing and end caps and directly coupled to earth ground.

The ballast circuit components are mounted on a circuit board in a known and customary manner and the circuit board is received within the elongate housing. More particularly, an elongate abutment shoulder and an elongate wall extending generally over the shoulder are provided on each of the interior surfaces of the housing vertically upstanding walls. The elongate walls form an elongate channel over the abutment shoulders. The elongate walls and shoulders on each of the housing vertical walls are generally coplanar and mirror images of one another and the circuit board outer edges are adapted to be received therebetween and with the circuit board edges sandwiched between the respective longitudinal elongate walls and abutment shoulders. The circuit board is slidingly received within the housing through either of its open ends.

The end caps are attached to the open ends of the housing with screws extending through holes in the end caps and which are threadingly received within the elongate channels formed by the elongate walls. Accordingly, the end caps are securely retained on the open ends of the housing and effectively prevent RFI and EMI from exiting the housing enclosure. Additionally, the fastening screws engage the channel forming elongate walls and the upper surface of the circuit board near the edges thereof forcing the circuit board lower surface against the elongate abutment shoulder and effectively frictionally retaining the circuit board in position.

The circuit board is effectively electrically connected to the ballast housing which is, in turn, connected to earth ground. More specifically, a grounding wire is affixed to the circuit board upper surface near and along one of the outer edges. The grounding wire includes two ends that extend through holes in the circuit board and which are connected by solder to trace on the lower surface of the circuit board. The grounding wire on the upper surface of the circuit board is located such that electrical contact is made with an outer elongate edge of the channel forming elongate wall. For providing a yet more positive inner connection, the grounding wire is located partially within the elongate channel and the fastening screw engages the grounding wire as well as the inner surface of the channel thereby providing positive electrical contact between the grounding wire and the housing. This structure is further cost effective since this fastening screw is also used for attaching an end cap to the housing.

In one form thereof, the present invention is directed to an apparatus for supporting and grounding a ballast circuit to a chassis. A circuit board whereupon ballast circuit components can be mounted is provided and the circuit board has an outer edge. A grounding wire is affixed to the circuit board near and along the edge and the grounding wire is coupled to the ballast circuit components. A mounting chassis is provided having an elongate abutment shoulder and an elongate wall extending generally over the shoulder and forming an elongate channel. The circuit board edge rests on the shoulder and the grounding wire extends longitudinally along and between the shoulder and channel. A fastening member is received longitudinally in the channel for engaging the grounding wire and the elongate wall forming the channel whereby electrical contact is provided between the grounding wire and the chassis.

In one form thereof the present invention is directed to an enclosure for decreasing transmission of RFI and EMI from a ballast circuit. The enclosure includes an elongate housing having first and second opposite open ends. The ballast circuit is received within the housing and is surrounded thereby. End caps are provided at each open end of the housing in closing engagement with the housing. Fastening members are provided at each end of the housing for retaining the end caps in closing engagement with the housing.

BRIEF DESCRIPTION OF THE DRAWINGS

The above mentioned and other features and objects of this invention and the manner of obtaining them will become more apparent and the invention itself will be better understood by reference to the following description of embodiments of the invention taken in conjunction with the accompanying drawings wherein:

FIG. 2 is an exploded perspective view of the ballast enclosure shown in FIG. 1;

FIG. 4 is an enlarged partial side elevation view of the ballast enclosure shown in FIG. 1 and showing a grounding structure according to the present invention;

FIG. 6 is a cross sectional view taken along line 6—6 of FIG. 4.

Corresponding reference characters indicate corresponding parts throughout the several views of the drawings.

The exemplifications set out herein illustrate preferred embodiments of the invention in one form thereof and such exemplifications are not to be construed as limiting the scope of the disclosure or the scope of the invention in any manner.

DETAILED DESCRIPTION OF A SPECIFIC EMBODIMENT

Figure 1:
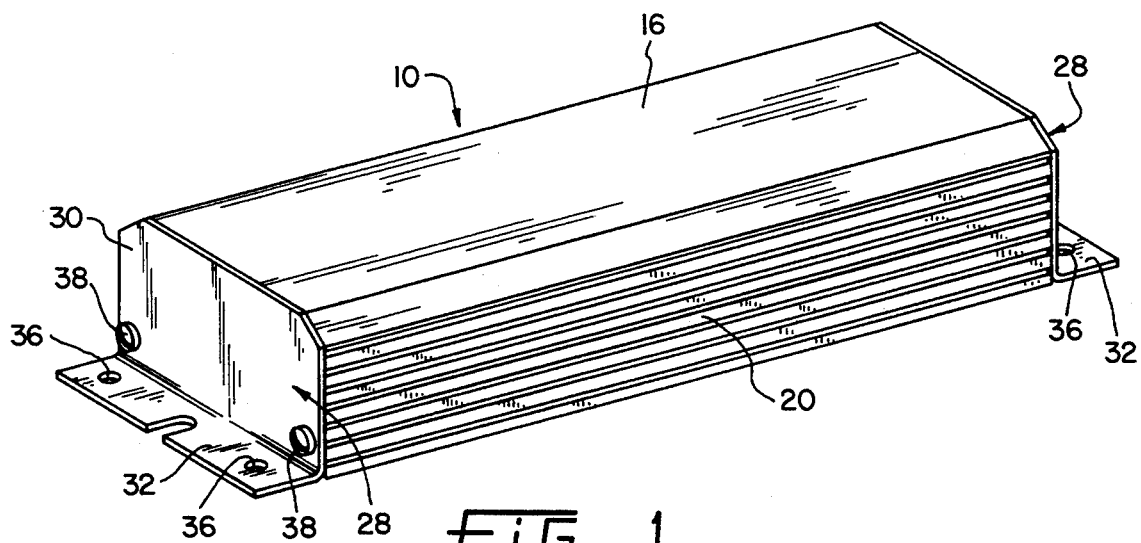
FIG. 1 is a perspective view of a ballast enclosure according to the present invention.
Figure 3:
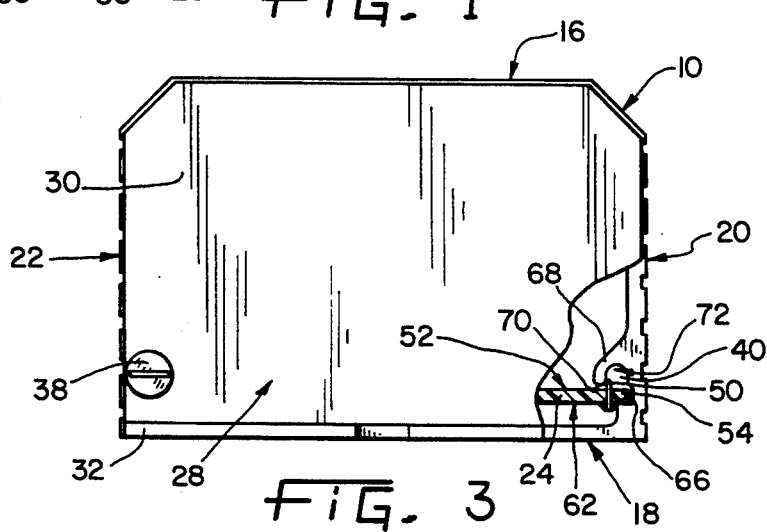
FIG. 3 is an end elevation view of the ballast enclosure shown in FIG. 1 and with a partial cut away section.

Referring to the drawings, a preferred embodiment of the ballast circuit enclosure and grounding structure includes a housing or chassis 10 which is generally elongate and has first and second opposite open ends 12 and 14. Housing 10 is preferably made of aluminum by an extrusion process and is cut to any desired length. Housing 10 includes an upper flat wall 16, lower flat wall 18, and vertical flat connecting walls 20 and 22 therebetween. Elongate ribs can be extruded directly onto the vertical connecting walls 20 and 22 as shown in FIGS. 1 and 2 for added stability and for aiding in the dissipation of heat.

A ballast circuit is received within housing 10 and includes a circuit board 24 and various electrical components 26 mounted thereon in a known and customary manner. The ballast circuit is enclosed within housing 10 via end caps 28 located at each open end of housing 10 and in closing engagement therewith. End caps 28 include a closure upstanding wall 30 having an outer perimeter shape generally in the same contour as that of the open ends of housing 10. Closure walls 30 are integrally formed with legs 32. Ballast attachment holes 34 are provided on closure walls 30 and fixture attachment holes 36 are provided on legs 32. Thus, end caps 30 are affixed to each of open ends 12 and 14 of housing 10 using screws 38 which extend through ballast attachment holes 34 and are received within elongate channels 40 formed within housing 10. Various other fasteners such as barbs or friction fit rods can be used in place of screws 38.

As can be appreciated, this enclosure including housing 10 and end caps 28 effectively enclose and capture any RFI and EMI that may be transmitted by the ballast circuit or components 26. The only potential leak is inbetween the end surfaces 42 and closure wall surface 44 of closure walls 30. However, it has been determined that RFI and EMI transmission therethrough is minimal and, as a consequence, substantially all RFI and EMI captured by housing 10 and end caps 30 are electrically grounded via fixture attachment screws 46 received through holes 36 and into a electrically earth grounded light fixture wall 48.

The preferred embodiment further provides for properly supporting and electrically grounding the ballast circuit located within housing 10. In this regard, circuit board 24 is provided with a grounding wire 50 extending along the upper surface 52 of circuit board 24 and near and along the circuit board longitudinal edge 54. Grounding wire 50 at each end thereof is bent forming posts 56 extending through circuit board holes 58. Grounding wire posts 56 are soldered with solder material 60 to the circuit board trace (not shown) located on the lower surface 62 of circuit board 24. Posts 56 and grounding wire 50 are, thus, coupled to the electronic components 26 of the ballast circuit for providing earth ground thereto.

As shown in FIG. 2, circuit board 24 is rectangularly-shaped and includes a second longitudinally extending elongate edge 64. As more fully discussed hereinbelow, edges 54 and 64 of circuit board 24 are supported on housing or chassis 10.

Each of the vertical connecting walls 20 and 22 of housing 10 is formed during the extrusion process with an elongate abutment shoulder 66 and an elongate curvilinear in cross sectional wall 68. Elongate wall 68 defines an outer elongate edge 70 and an inner curvilinear elongate wall 72. Thus, elongate wall 68 defines and/or forms the elongate channel 40 opening downwardly towards the upper surface 52 of circuit board 24. As shown in FIG. 2, both vertical connecting walls 20 and 22 are provided with an abutment shoulder 66 and elongate wall 68 forming a channel 40 and both are identical mirror images of one another.

As shown in FIGS. 3 through 6, grounding wire 50 extends generally parallel to elongate wall 68 and is positioned on circuit board 24 so as to be in contact with elongate wall 68. Preferably, grounding wire 50 makes contact with the inner surface 72 or edge 70 of elongate wall 68.

As can now be appreciated, circuit board 24 is inserted within housing 10 by merely placing edges 54 and 64 on abutment shoulders 66 and under elongate walls 68 and longitudinally sliding circuit board 24 into housing 10. It is noted that abutment shoulders 66 are sufficiently high above housing lower wall 18 so that trace and solder on the lower surface 62 of circuit board 24 does not make contact therewith. The electrical components 26 are also sized properly so as to fit within housing 10 under upper flat wall 16.

Figure 5:
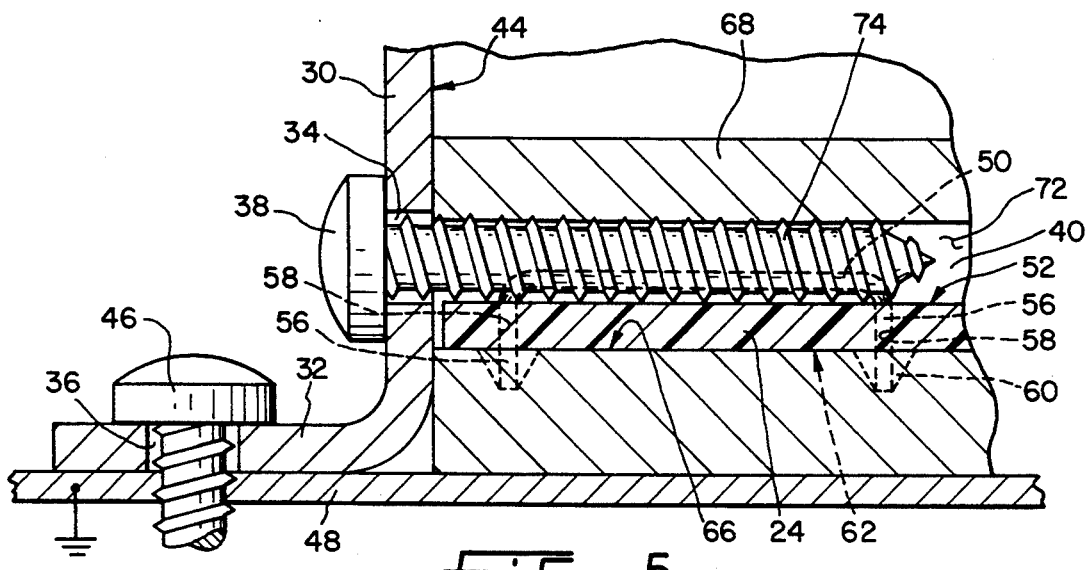
FIG. 5 is a cross sectional view taken along line 5—5 of FIG. 4.

After circuit board 24 has been placed within housing 10, end caps 28 are attached to the housing open ends 12 and 14 using screws 38. However, as shown in FIGS. 4-6, as screws 38 are received within channels 40, threads 74 thereof are sized slightly larger than the inner curvilinear surface 72 forming channel 40 and thus also engage the upper surface 52 of circuit board 24 and forcing the circuit board lower surface 62 against abutment shoulder 66. Accordingly, with screws 38 not only are end caps 28 attached to housing 10, but circuit board 24 is positively and rigidly retained against abutment shoulders 66.

Further yet, for providing a positive ground connection between grounding wire 50 and earth ground, as best shown in FIG. 4, threads 74 are sized sufficiently large in outer diameter so as to also engage the grounding wire 50 and in part force grounding wire 50 toward edge 70 and surface 72 of elongate wall 68. Thus, a positive electrical connection is provided from grounding wire 50 to screw 38 and/or housing 10 which is, in turn, connected to earth ground through fixture attachment screws 46 and fixture wall 48. It is noted that grounding wire 50 need not be provided at each of the four (4) screws 38 and that only one such interconnection is needed for proper grounding. As also discussed hereinabove, other fastening members are contemplated as potential replacements for screws 38 such as barbs, friction fit rod, etc.

While the invention has been described as having specific embodiments, it will be understood that it is capable of further modification. This application is, therefore, intended to cover any variations, uses, or adaptations of the invention following the general principles thereof and including such departures from the present disclosure as come within known or customary practice in the art to which this invention pertains and fall within the limits of the appended claims.

What is claimed is:

1. An apparatus for supporting and electrically grounding a ballast circuit to a chassis, said apparatus comprising:
   a circuit board whereupon ballast circuit components can be mounted;
   said circuit board having circuit board trace and an outer edge;
   a grounding wire affixed to said circuit board near and along said edge and coupled to said circuit board trace;
   a supporting chassis having an elongate abutment shoulder and an elongate wall extending generally over said shoulder, said elongate wall forming an elongate channel;
   said circuit board edge resting on said shoulder and said grounding wire extending longitudinally along and between said shoulder and channel; and,
   fastening means received longitudinally in said channel for engaging said grounding wire and said elongate wall, whereby electrical contact is provided between said grounding wire and said chassis.

2. The apparatus of claim 1 wherein said chassis comprises an elongate housing having an open end, said circuit board being received within said housing and surrounded thereby and, an end cap at said open end of said housing in enclosing engagement with said housing, whereby RFI and EMI transmitted by the ballast circuit is captured.

3. The apparatus of claim 2 wherein said fastening means extends through a hole in said end cap and attaches said end cap to said chassis.

4. The apparatus of claim 3 wherein said fastening means is a screw.

5. The apparatus of claim 1 wherein said chassis further includes a second elongate abutment shoulder and a second elongate wall extending generally over said second shoulder and forming a second elongate channel, and further wherein said circuit board includes a second outer edge, said circuit board second outer edge resting on said second abutment shoulder, whereby said circuit board is supported on said shoulders.

6. The apparatus of claim 5 wherein said circuit board includes an upper surface and a lower surface, said lower surface being in contact with and resting on said shoulders and said elongate walls extending over said upper surface, whereby said circuit board edges are sandwiched between said elongate shoulders and walls.

7. The apparatus of claim 6 wherein said channels open towards said upper surface, a fastening means received in both of said channels and engaging said circuit board upper surface and forcing said lower surface against said abutment shoulders.

8. The apparatus of claim 7 wherein said elongate wall includes an inner surface, said grounding wire being on said upper circuit board surface and in contact with said elongate wall inner surface.

9. The apparatus of claim 1 wherein said circuit board includes an upper surface and a lower surface, said lower surface being in contact with and resting on said abutment shoulder and said elongate wall extending over said circuit board upper surface, whereby said circuit board edge is sandwiched between said elongate shoulder and wall.

10. The apparatus of claim 9 wherein said channel opens toward said circuit board upper surface, said fastening means also engaging said circuit board upper surface and forcing said lower surface against said abutment shoulder.

11. The apparatus of claim 10 wherein said elongate wall includes an inner surface, said grounding wire being on said upper circuit board surface and in contact with said elongate wall inner surface.

12. The apparatus of claim 1 wherein said elongate wall includes an inner surface, said grounding wire being in contact with said elongate wall inner surface.

13. An enclosure for capturing transmitted RFI and EMI from a ballast circuit, said enclosure comprising:
   an elongate housing having first and second opposite open ends;
   ballast circuit components received within said housing and surrounded thereby;
   end caps at each open end of said housing in closing engagement with said housing;
   fastening means at each end of said housing for retaining said end caps in closing engagement with said housing;
   a circuit board whereupon said ballast circuit components are mounted;
   said circuit board having an outer edge;
   a grounding wire affixed to said circuit board near and along said edge coupled to said ballast circuit components;
   an elongate abutment shoulder and an elongate wall in said housing, said elongate wall extending generally over said shoulder and forming an elongate channel;
   said circuit board edge resting on said shoulder and said grounding wire extending longitudinally along and between said shoulder and channel; and,
   said fastening means received longitudinally in said channel and engaging said grounding wire and said elongate wall, whereby electrical contact is made between said grounding wire and said housing.

14. The enclosure of claim 13 wherein said fastening means extends through a hole in one of said end cap and attaches said end cap to said housing.

15. The enclosure of claim 13 wherein said circuit board includes an upper surface and a lower surface, said lower surface being in contact with and resting on said abutment shoulder and said elongate wall extending over said upper surface, whereby said circuit board edge is sandwiched between said elongate shoulder and wall.

16. The enclosure of claim 15 wherein said channel opens toward said upper surface, said fastening means also engaging said circuit board upper surface and forcing said lower surface against said abutment shoulder.

17. The enclosure of claim 16 wherein said elongate wall includes an inner surface, said grounding wire being on said upper circuit board surface and in contact with said elongate wall inner surface.

18. The enclosure of claim 13 wherein said elongate wall includes an inner surface, said grounding wire being in contact with said elongate wall inner surface.

19. The enclosure of claim 13 wherein said housing is made of aluminum and is formed by extrusion.

* * * * *